United States Patent [19]

Eitrheim et al.

[11] Patent Number: 5,159,210

[45] Date of Patent: Oct. 27, 1992

[54] LINE PRECHARGING CIRCUITS AND METHODS

[75] Inventors: John K. Eitrheim, Garland; Mark Bluhm, Carrollton, both of Tex.

[73] Assignee: Cyrix Corporation, Richardson, Tex.

[21] Appl. No.: 766,849

[22] Filed: Sep. 27, 1991

[51] Int. Cl.$^5$ ...................... H03K 17/16; H03K 19/96

[52] U.S. Cl. .................................... 307/480; 307/443; 307/246; 307/572; 307/481

[58] Field of Search ............... 307/443, 480, 481, 239, 307/246, 571, 572, 263

[56] References Cited

U.S. PATENT DOCUMENTS

| | | | |
|---|---|---|---|
| 4,763,023 | 8/1988 | Spence | 307/246 X |
| 4,983,860 | 1/1991 | Yim et al. | 307/480 X |
| 4,988,888 | 1/1991 | Hirose et al. | 307/246 X |

OTHER PUBLICATIONS

Bakoglu, H. B. et al., "CMOS Driver and Receiver Circuits for Reduced Interconnection Delay", *International Symposium On VLSI Technology, Systems and Applications*, pp. 171–175, Taipei, Taiwan, May 1985.

*Primary Examiner*—David Mis
*Attorney, Agent, or Firm*—Baker & Botts

[57] ABSTRACT

A bus precharge circuit is provided that precharges a bus line or node as an inverse function of the precharge level already attained on the bus line, such that the precharge level on the bus line is gradually approached. The precharge circuit charges the bus line to a midpoint between high and low logic states. The preexisting state of the bus line is stored and is used to select one of two voltage supplies to which the bus line may be partially pulled up or down. The switchpoint of a precharge circuit sensing gate is set to be equivalent to the switchpoint of the receiving gate of receiver on the bus line.

30 Claims, 3 Drawing Sheets

LINE PRECHARGING CIRCUITS AND METHODS

TECHNICAL FIELD OF THE INVENTION

The present invention relates in general to electronic circuits, and more particularly to methods and apparatus for precharging a line.

BACKGROUND OF THE INVENTION

Bus precharge circuits have been known in the art for charging capacitive loads such as data or address buses. The basic function of a precharge circuit is to charge a data communication line to a preselected value in an attempt to save time in the transfer of data. Charging data lines takes a certain amount of time because of the RC time constant associated with charging up the capacitance of the line. To the extent this can be done by a precharge phase in between data cycles, time can be saved. A bit of data may then be introduced onto the line and the voltage value of the line will be selectively changed (or not) in order to represent the state of the bit of data.

In one precharging scheme, binary "zero" and "one" bits are represented on the data line by zero volts and some positive voltage, such as five volts, respectively. If a "zero" bit is transmitted using the data line, the voltage on the data line will be driven down to zero volts; otherwise, if a "one" bit is to be transmitted, the line is left at +5 volts. Each register connected to this line will typically have a switchpoint, or a voltage below which the register will sense and store one state, and above which the other state will be sensed and stored. According to the above conventional precharging scheme, the bus actually has to be precharged to a level higher than the switchpoint of the receiving register or receiver. An overshoot has to be designed into the precharging scheme which causes an additional time delay when transmitting a "zero" level.

Also, high-point precharge schemes are susceptible to noise problems. This is because the charge on the high impedance bus itself will be responsible for writing a register if a "one" bit is desired to be transmitted. Since the precharge voltage value is the same as the logic "one" value, and since the switchpoint of the receiver is often set near the precharge value in order to optimize speed, noise, as from coupled, adjacent bus wires, may cause a misreading of the data to be transferred.

Also, in conventional bus or line sensing precharging schemes, the rate of precharge is substantially linear as it approaches a level to which the line is to be precharged. This worsens the amount of precharge overshoot, and therefore causes the additional consumption of time when dropping the precharged line to a logic level not associated with the precharge value.

Midpoint precharge schemes are known in the art, such as the one shown by H. B. Bakoglu and J. D. Meindl in "CMOS Driver and Receiver Circuits for Reduced Interconnection Delays", *International Symposium on VLSI Technology, Systems and Applications*, pp. 171–175, Taipei, Taiwan, May 1985. Midpoint precharging schemes have the advantage of not having a logic level of the line associated with the precharge value. Therefore, there is no reliance on the precharge voltage as a data value, conferring noise immunity. Unfortunately, the Bakoglu scheme is not suitable for a bus line having multiple ports. The Bakoglu precharge circuit is built right into each data receiver, rather than according one precharge circuit per line with multiple receivers on them. Also, the Bakoglu precharge scheme uses two inverters for sensing, causing a total of four-gate delays before turn off.

U.S. Pat. No. 4,763,023 issued to Spence shows a circuit precharge scheme in which a line can be precharged to a predetermined precharged value VPC. However, the Spence precharge circuit uses a P-channel pullup device with a linear precharge characteristic, thus, increasing precharge overshoot, and shows a precharging inverter that is connected to a line only through a gate, causing an additional gate delay.

In view of the foregoing, a need exists for a precharge circuit that produces no ringing or oscillation during precharge; has timing which is process independent; precharges the bus or line to exactly the switchpoint of the receiving device in order to maximize speed; operates well over a wide range of supply voltages; and has noise immunity.

SUMMARY OF THE INVENTION

According to one aspect of the invention, a node precharging circuit comprises a sensing gate having an input connected to the node to be precharged. A control output of the sensing gate assumes a varying state that is a function of the varying state of precharge of the node. The circuit also includes precharging circuitry operable to couple a supply voltage to the node. A control input of the precharging circuitry is coupled to the control output of the sensing gate. The precharging circuitry gradually decouples the supply voltage from the node to be precharged in response to a continuous change in a predetermined direction of the state of the control output of the sensing gate.

According to another aspect of the invention, an integrated circuit has a precharge circuit including a sensing gate. An input of the sensing gate is coupled to a bus line. At least one data receiver has a receiving gate with an input coupled to this bus line. The conductance switchpoints of the sensing gate and the receiving gate are made to be substantially equal to each other.

According to yet another aspect of the invention, a node precharging circuit is operable to assume a selected one of two data states, with the node precharged to a preselected voltage value between the two data states. This precharging circuit includes a latch having an input coupled to the node during a data phase and, an output of the latch having a state reflecting a state of the node last sensed by the latch. A first switching device is operable to couple a first supply voltage to the node in response to a first state of the output of the latch. A second switching device is operable to couple the second supply voltage to the node in response to a second state of the output of the latch.

The precharge circuit of the invention has several technical advantages. First, there is no ringing or oscillation during precharge, as the state of the bus is latched. That is, a latch state tells where the bus was before precharge. Then, the bus is pulled either up or down to the precharge level, depending on the initial data level.

A second technical advantage is that there is little or no overshoot with the precharge circuit of the invention. First, there is experienced only one gate delay to sense the bus level and control precharging. Second, the rate of precharge gradually curves to the final precharge level such that the precharge circuit will not have a tendency to spike through the precharge level that is sought.

A third technical advantage of the invention is its process independence because of a match between an inverter in the precharge circuit and an inverter in each of the receivers connected to the bus or line. In the prior art, the switchpoint of the data receiver varies greatly with the semiconductor process. On the other hand, according to this aspect of the invention, the inverters of the precharge circuit and each data receiver circuit are matched so that the switchpoints in them will also be matched over variations in process, temperature and supply voltages.

A fourth technical advantage concerns speed. Since the bus is precharged to exactly the switchpoint of the receiving device, no further time is lost by having to drive the line to a level that is above or below the switchpoint.

A fifth technical advantage is noise immunity. The precharge level is not used to drive the data into a register. When data is transferred, a bus driver drives the precharge line either substantially above or below the precharge level; hence, there is no possibility of a misreading or miswriting of data because of a noisy precharge level.

BRIEF DESCRIPTION OF THE DRAWINGS

Other aspects of the invention and their advantages may be discerned by the following detailed description when taken in conjunction with the drawings in which like parts are numbered by like characters, and in which.

DETAILED DESCRIPTION OF THE INVENTION

The preferred embodiment of the present invention and its advantages are best understood by referring to FIGS. 1–7 of the drawings, like numerals being used for like and corresponding parts of the various drawings.

Figure 1:
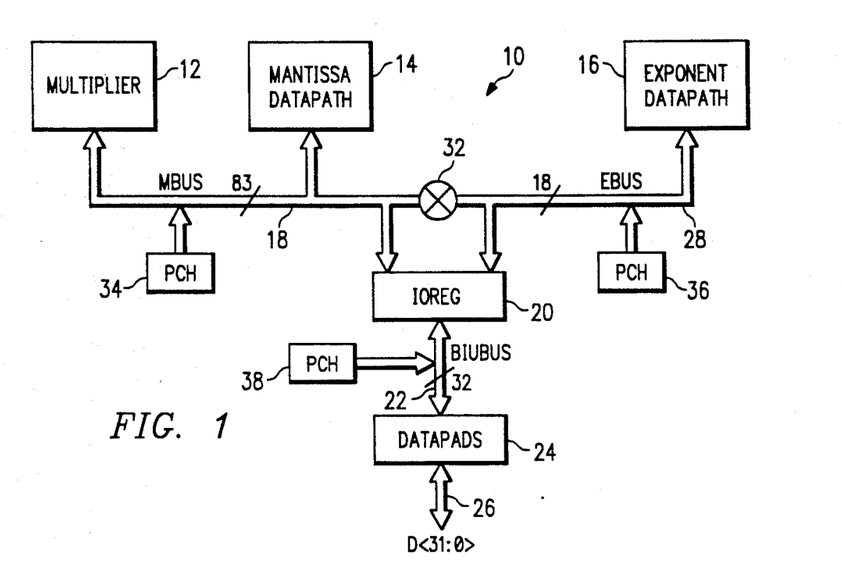
FIG. 1 is a high level schematic diagram of a mathematics coprocessor using precharge circuitry according to the invention.

FIG. 1 is a high level schematic diagram of a mathematics coprocessor indicated generally at 10. Mathematics coprocessor 10 is only representative of an integrated circuit in which the precharge circuit according to the invention may be used; a precharge circuit according to the invention may be used to precharge a node or line in any integrated circuit.

Coprocessor 10 includes several high-level circuit blocks which operate on and manipulate data. These include a multiplier circuit block 12, a mantissa datapath 14, and an exponent datapath 16. A mantissa bus or MBUS 18 has 83 individual data lines, and connects to respective registers (not shown) in the multiplier 12 and the mantissa datapath 14. MBUS 18 is also connected to an input/output register block 20 which itself comprises a series of registers (not shown) for the storage of data. The input/output register 20 is connected through a 32-line bus (BIUBUS) 22 to a set 24 of datapads. The datapads 24 are connected to another device, such as a microprocessor, through input/output leads 26.

An 18-line exponent bus or EBUS 28 is connected to an exponent datapath 16 and the input/output register block 20. A bus cross connect 32 selectively connects the EBUS 28 to certain lines of the MBUS 18.

A bus precharge circuit block 34 is provided to precharge the data lines of the mantissa MBUS 18. Similarly, a bus precharge circuit block 36 is provided to precharge the lines of EBUS 28, and a bus precharge circuit 38 is provided to precharge the lines of the input/output bus 22. Bus precharge circuits 34, 36 and 38 contain similar precharge circuits. The bus precharge circuit 34 contains 83 individual precharging circuits, one for each line of the MBUS 18. Precharge circuit block 36 has 18 precharge circuits, one for each of the lines in the EBUS 28, and precharge circuit block 38 has 32 precharging circuits.

As mentioned above, the multiplier block 12, mantissa datapath 14, exponent datapath 16 and input/output register 20 each contain a plurality of data registers that are connected to one of the MBUS 18 and EBUS 28. One advantage of the architecture according to the invention is that, despite the numerous registers connected to each line of the buses 18 and 28, only one precharge circuit need be accorded for each line of each bus.

Figure 2:
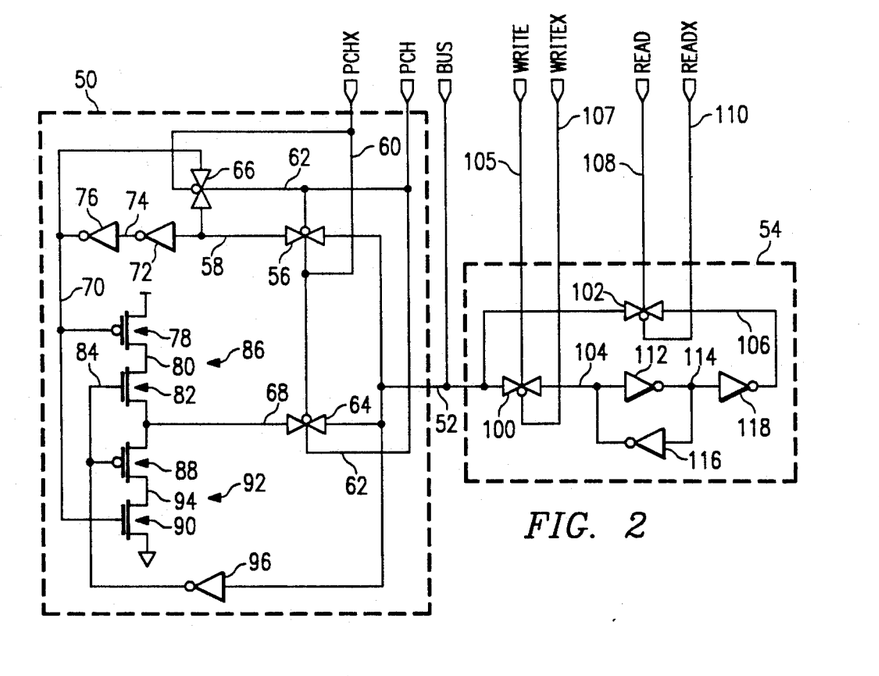
FIG. 2 is a detailed electrical schematic diagram of a precharge circuit according to the invention in conjunction with a bus line and a combined data transmission/receiving register.

FIG. 2 is a detailed electrical schematic diagram of a preferred embodiment of a single precharge circuit, indicated by the dashed rectangle 50, as connected through a bus line 52 to a combined receiving and transmitting data register indicated by the dashed rectangle 54. A CMOS pass gate 56 consists of an N-channel field effect transistor and a P-channel field effect transistor having data paths connected in parallel (not shown), such that the bus line 52 is selectively connected to a line or node 58. A signal line or node 60 carries a PCHX signal. The inverse of this signal, or PCH, appears on a line or node 62. CMOS pass gates 64 and 66 are constructed in a manner similar to CMOS pass gate 56. CMOS pass gate 64 selectively connects the bus line 52 to a node 68 while CMOS pass gate 66 is operable to connect the node 58 to a an electrical node 70. The PCHX signal is applied to the gate of the N-channel transistor (not shown) of pass gate 56 and the gate of the P-channel transistor (not shown) of each of gates 64 and 66. The PCH signal is applied to the gate of the P-channel transistor (not shown) of pass gate 56 and the gate of the N-channel transistor (not shown) of each of pass gates 64 and 66.

Node 58 is connected to an input of an inverter 72, whose output is connected to a node 74. Node 74 is connected to the input of a second inverter 76, whose output is connected to a latch node 70. Inverters 72 and 76 together form a latch for the storage of the preexisting state of the bus line 52, as will be explained further below. Node 70 latches the value of the bus line 52 during operation of the circuit.

A P-channel field effect transistor is indicated generally at 78 and has a gate connected to the latch node 70, a first end of its channel connected to a positive power supply such as VDD, and a second end of its channel connected to a node 80. The channel of an N-channel field effect transistor indicated generally at 82 has a first end connected to the node 80 and a second end connected to the node 68. A gate of transistor 82 is connected to a node 84. Transistors 78 and 82 together comprise a pullup circuit indicated generally at 86.

A P-channel field effect transistor, indicated generally at 88, and an N-channel field effect transistor indicated generally at 90 together comprise a pulldown circuit indicated generally at 92. A channel of the P-channel transistor 88 selectively connects the node 68 to a node 94. The gate of the P-channel field effect transistor 88 is connected to the node 84. The N-channel field effect transistor has a channel that connects node 94 to a supply of low voltage, such as ground. The gate of transistor 90 is connected to the latch node 70.

The precharge circuit 50 is completed by a sensing gate 96. An input of the sensing gate 96 is connected to the bus line 52, while an output thereof is connected to the node 84. The sensing gate preferably comprises a P-channel field effect transistor (not shown) having a channel selectively connecting a supply such as VDD to the node 84, and an N-channel field effect transistor (not shown) having a channel selectively connecting the node 84 to a low voltage supply or ground. The gates of the P and N-channel transistors are connected in parallel to the bus line 52. In an alternative embodiment (not shown), sensing gate 96 may have two additional select or clocking transistors respectively interposed between one of the supply voltages and one of the inverter pair.

Bus line 52 is, in the illustrated embodiment, the node that is to be precharged by operation of the precharge circuit 50. It is connected to each of several data registers, only one of which is illustrated by data register 54. The bus line 52 is preferably connected to respective inputs of a write pass gate 100 and a read pass gate 102. Pass gates 100 and 102 preferably take a form similar to pass gate 56 of the precharge circuit 50. The channels of pass gate 100 are operable to connect the bus line 52 to a node 104 by the selective application of WRITE and WRITEX signals on respective signal lines 105 and 107. Similarly, the channels of the pass gate 102 are operable to connect the bus line 52 to a node 106 by the selective application of READ and READX signals on respective signal lines 108 and 110.

The register includes a receiving gate or inverter 112 that is preferably constructed to be similar to the sensing gate 96. In a preferred embodiment of the invention, the switchpoints of the sensing gate 96 and the receiving gate 112 should be very close to each other or identical. It is preferred that the switchpoint be set to VDD/2, or about 2.3 volts in the instance illustrated by FIG. 3 (described below). In order to accomplish this, the ratio of the P-channel width to the N-channel width in each of the inverters 96 and 112 should be approximately 2.5. If the precharge level on bus line 52 is desired to be changed upward or downward from 2.3 volts, the P to N-channel width ratios should be changed accordingly. For a low supply voltage operation, the P to N-channel width ratio should be approximately 3 to 1. This is because the P-channel device becomes proportionally weaker than the N-channel device as the VDD power supply drops. If sense gate 96 is clocked or selected, then similar select or clocking transistors should be added to receiving inverter 112.

The output of the receiving gate 112 is connected to a node 114. Node 114 is connected to the inputs of an inverter 116 and an inverter 118, respectively. The output of inverter 118 is connected to the read output node 106, while the output of the inverter 116 is connected to the write input node 104.

Circuits according to the present invention have the unusual ability to operate over a wide range of $V_{DD}$ supply voltages, such as 2.5 to 6.0 volts. In particular, the circuits herein described are capable of operating with $V_{DD}$ supply voltages of 3.0 and 5.0 volts, making them suitable for integration into a wide range of chips and systems having either 3.0 volt or 5.0 volt power supplies. The one limitation for low-voltage operation is set by the threshold voltages of devices 82 and 88; these threshold voltages should be set to less than half of $V_{DD}$ for proper operation. The remaining embodiments described herein may also operate with any voltage supply in the approximately 2.5V–6.0V range.

Figure 3:
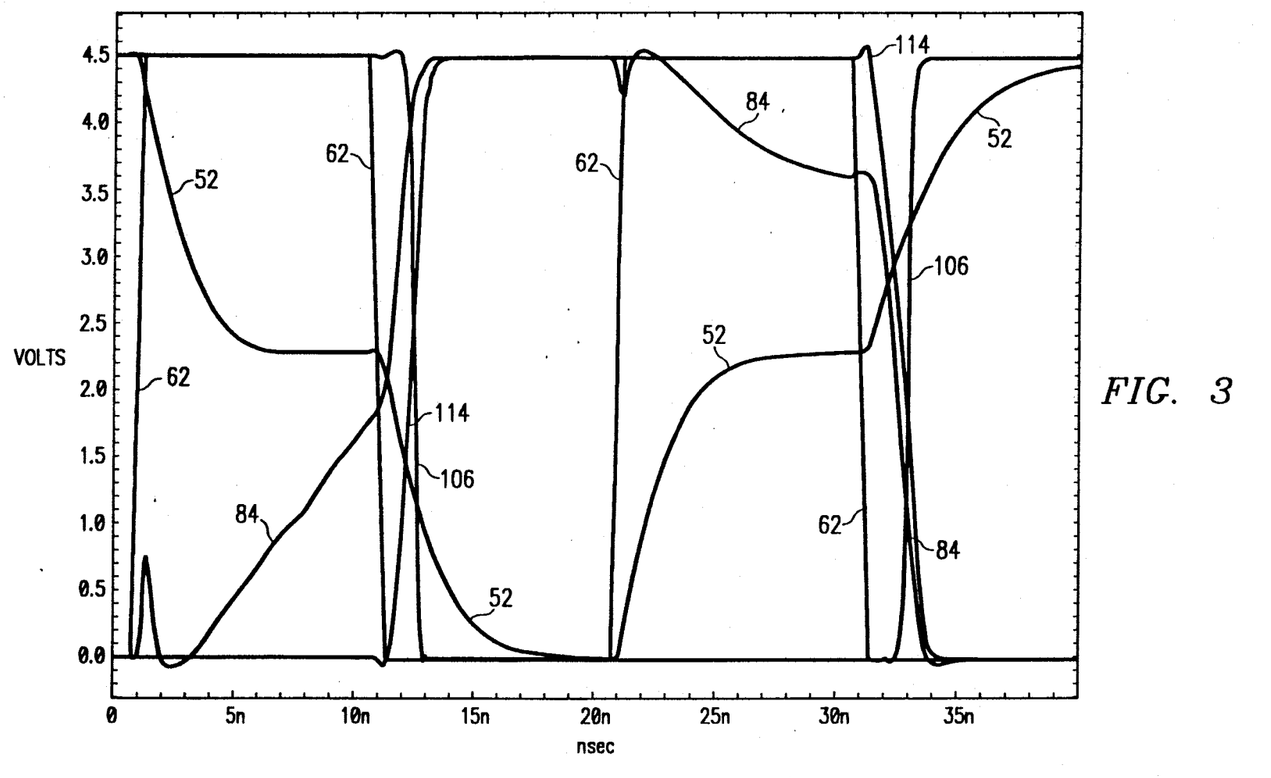
FIG. 3 is a timing diagram showing the voltage with respect to time of various nodes of the circuit shown in FIG. 2, and illustrating the operation of the invention.

The operation of the preferred embodiment according to the invention may be best described in conjunction with FIG. 3, which is a timing diagram showing the voltages of various nodes in FIG. 2. The timing plots have been identified with the same numbers as the nodes to which they pertain.

Shortly after one nanosecond, the PCH signal is brought high on line or node 62. This opens pass gates 64 and 66 and closes pass gate 56. In this first illustrated cycle, the state of the bus line 52 was previously high at approximately 4.5 volts. The state of bus line 52 is reflected in a high voltage state of latch node 70. The latched state of latch node 70 is reinforced by the opening of pass gate 66. The high state of latch node 70 will close P-channel gating transistor 78, and open N-channel gating transistor 90. Hence, the preexisting state of the bus line 52 is used to select to which of the two supply voltages the bus line 52 will be connected during the precharge phase.

A high state on the bus line 52 is translated through the sensing gate 96 to produce a beginning low state on node 84. The low state on node 84 will, in the beginning, shut off the N-channel transistor 82 and open P-channel transistor 88. Thus, since the pass gate 64 is open, the high voltage on bus line 52 will begin to sink toward ground through the pass gate 64, P-channel transistor 88 and N-channel transistor 90.

It is a characteristic of the P-channel device 88 that, when it is connected between ground and a higher charge node as shown, the conductance of its channel will vary as a multi-order inverse exponential function of the voltage applied to its gate, in this case the voltage of node 84. As the voltage on the bus line 52 is lowered, the voltage on node 84 begins to rise, gradually reducing the conductance of transistor 88. Eventually, the voltage on node 84 will be so high that the P-channel transistor 88 will in essence be shut off, closing off the path to the ground. With an appropriate selection of the switchpoint of the sense gate 96, the bus line 52 will then be precharged to approximately VDD/2, or in the illustrated case about 2.3 volts.

Now that the precharge phase of the cycle has been completed, signal PCH is brought low, shown by the precipitous drop of plot 62 in FIG. 3. A data transfer phase of the cycle is next entered in which a logic "zero" is desired to be placed on bus line 52. Assuming momentarily that register 54 is the source of this value, a high voltage state will be stored at node 114, which translates to a low voltage state on node 106. The pass gate 102 is opened by the application of READ and READX signals to begin the transfer of the low state to the bus line 52. The bus line 52 then drops to a low state as the capacitance associated with the bus line is discharged. In FIG. 3, the plots of nodes 106 and 114 are shown forced by the voltage on line 52, which will cause a low state of node 114 once the switchpoint of receiving gate 112 has been attained.

At approximately 20 nanoseconds, a next precharge cycle is initiated by once again raising the PCH signal 62 to a high state. Now that a low state exists on bus line 52, the precharge circuit 50 will behave differently. A low state on bus line 52 will have been communicated to the latch node 70 as a low state, thereby turning on P-channel transistor 78 and turning off N-channel transistor 90. This selects the high voltage supply, so that the precharge circuit 50 will know to charge the line up to VDD/2 rather than drop the line to VDD/2. This prevents precharge ringing or oscillation. The sensing gate 96 inverts the low state on the bus line 52 to a high state on node 84. This means that initially, the N-channel transistor 82 is on and the P-channel transistor 88 is off.

Since a path has been established to the VDD voltage supply, the voltage on node 52 will begin to rise. This in turn will be reflected in a drop in voltage on node 84. In a mirror image of a characteristic of the P-channel transistor 88, an N-channel transistor, when connected between a voltage supply and a node lower than it, will shut off approximately as a multi-order inverse exponential function of the voltage supplied to its gate. Hence, as the voltage on node 84 is lowered, the N-channel transistor 82 delivers less and less charge to the bus line 52 until finally the N-channel transistor effectively ceases operation altogether. The bus line will then be precharged to the predetermined precharge value, in this case VDD/2.

To start the next data cycle, the precharge signal 62 is dropped. Suppose that bus line 52 is to be charged up to a high state by a register 54 storing a logic "one". The node 106 is connected to the bus line 52 by application of appropriate READ and READX signals to the read gate 102.

In the instance where the register 54 is being written into, the state of the bus line 52 is communicated to the node 104 by opening the pass gate 100. As node 52 rises, the switchpoint of the receiving gate 112 is exceeded, latching in a high state at node 106. Note that the charge stored on the bus during the precharge cycle is not depended upon to drive the data into the register 54.

A maximum of speed is achieved by having the bus precharge chosen exactly as the voltage switchpoint of the receiving device, in this case, gate 112. Only a slight movement of the bus is required to write a bit to a register. This match is achieved by matching the construction of inverters 96 and 112. In the prior art, the switchpoint of the receiving latch could vary greatly with respect to the bus precharge level with changes in the manufacturing process, supply voltage or temperature. However, in the present invention, as processing or environmental parameters vary, they will affect gates 96 and 112 equally, thereby continuing the match of switchpoints.

Also, the invention may be contrasted to the prior art in the way that the precharge transistors pull up or pull down the bus line 52. In the prior art, an N-channel transistor was used to pull down the bus line, while a P-channel transistor was used to pull it up. The pullup and pulldown were linear rather than reverse-exponential, causing precharge overshoot. Overshoot is precluded by precharging to the exact receiving gate switchpoint voltage and approaching the precharge level as an asymptote.

The prior state of bus line 52, as latched on node 70, provides the additional advantage that there is no ringing or oscillation during the precharge. This is because only a selected one of the voltage supplies is connected at any which time. The bus is either pulled up or pulled down, but not both. In the prior art, an oscillation would occur because of overshoot. Overshoot reduction is also accomplished because only one gate delay is encountered to begin to turn off the channel to the precharge voltage supply.

Figure 4:
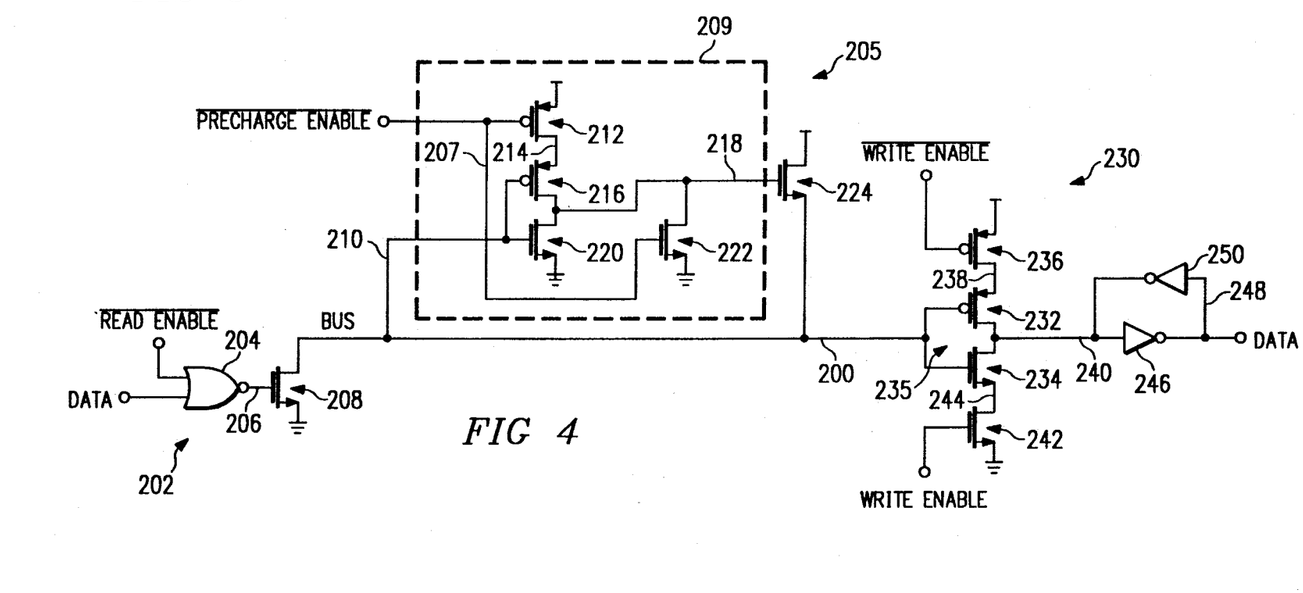
FIG. 4 is an electrical schematic circuit diagram of an alternative embodiment according to the invention.

FIG. 4 is a detailed schematic circuit diagram of an alternative embodiment of the invention. A bus line 200 has connected to it a bus driver indicated generally at 202. The bus driver 202 includes a NOR gate 204 with $\overline{\text{READ ENABLE}}$ and data inputs and an output 206. Output 206 is connected to the gate of an N-channel field effect transistor 208, which has a channel that selectively connects the bus 200 to ground.

A bus precharge circuit is indicated generally at 205. The bus precharge circuit includes a NOR gate indicated by the dashed enclosure 209. NOR gate 209 has a $\overline{\text{PRECHARGE ENABLE}}$ input 207 and a bus input 210. The $\overline{\text{PRECHARGE ENABLE}}$ input is connected to the gate of a P-channel transistor 212, which is operable to connect a high voltage supply to a node 214. The channel of a P-channel transistor, indicated generally at 216, is operable to connect node 214 to a node 218. An N-channel transistor indicated generally at 220 is operable to connect the node 218 to ground.

An N-channel transistor 222 is operable to connect node 218 to ground, and has a gate controlled by $\overline{\text{PRECHARGE ENABLE}}$ node 207. Node 218 is also connected to the gate of a pullup transistor indicated generally at 224, which is operable to connect the bus line 200 to a high voltage supply.

A bus receiver indicated generally at 230 includes a receiving gate 235 formed by P-channel transistor 232 and N-channel transistor 234. Bus line 200 is connected to the gates of transistors 232 and 234. A P-channel field effect switching transistor indicated generally at 236 is operable to connect a node 238 to a high-voltage supply upon the application of a low state of $\overline{\text{WRITE ENABLE}}$. P-channel transistor 232 is operable to connect node 238 to a node 240. In a similar manner, an N-channel field effect transistor indicated generally at 242 is operable to connect a node 244 to ground upon the application of a $\overline{\text{WRITE ENABLE}}$ signal to its gate. N-channel transistor 234 is operable to connect node 244 to the output node 240 of the receiving gate. An input of an inverter 246 is connected to the node 240, while an output thereof is connected to a node 248. An inverter 250 has an input connected to the node 248, and an output connected back to node 240.

In operation of the circuit shown in FIG. 4, between bus transfers, the precharge circuit 205 serves to raise the bus 200 to a level just high enough to be quickly detected as a logic high by the bus receiver indicated generally at 230. During a bus transfer, the bus driver 202 is enabled to drive low data on the bus and the bus receiver 230 is enabled to capture data from the bus. When the bus precharge is enabled by a low state of $\overline{\text{PRECHARGE ENABLE}}$, and if the bus is initially discharged (that is, it is a logic low level), then the output of the sensing gate 209 will go high at node 218, thus enabling the pullup device 224 to pull the voltage of bus 200 high. The bus will continue to rise until its level approaches the switchpoint of the sensing gate 209, which will cause the output 218 of the sensing gate to go low, and will disable the pullup device 224 on the bus. This will leave the bus 200 at a high impedance state at a level close to the switchpoint of the sensing gate 209 and slightly above the switchpoint of the receiving gate 235. Slight overshoot may result due to the switching delay of the sensing gate 209. This effect is minimized because the rate at which the bus 200 rises decreases as the bus voltage level increases, since the strength of the pull device 224 is relative to its gate-to-source voltage.

If the bus 200 has not been discharged when the bus precharge circuit 205 is enabled, the pullup device 224 will remain off, leaving the bus 200 at its previous level. If leakage has eroded the bus level, the sensing gate 209 will switch and cause the bus 200 to be restored to its proper level. Unlike the embodiment shown in FIG. 2, the switchpoint of the sensing gate 209 should be adjusted high enough with respect to the switchpoint of the receiving gate 235 such that the precharge level will fully switch the receiving gate 235. Yet it should be set as low as possible to quickly switch the receiver 230 when the bus 200 is driven low. The gate switchpoint is the input voltage that results in an equal output voltage. The difference between the bus precharge level and the receiver switchpoint will not change much with variations in transistor thresholds, since both the sensing gate 209 and the receiving gate 235 are similar in design and their switchpoints will track well with changes in transistor characteristics.

Figure 5:
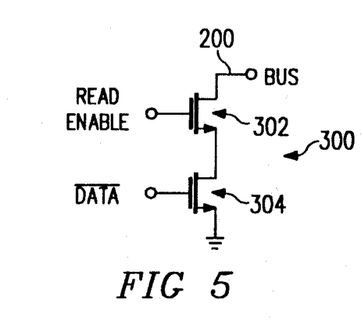
FIGS. 5, 6 and 7 are details of further alternative embodiments of the invention, replacing various components of the circuit shown in FIG. 4.
Figure 6:
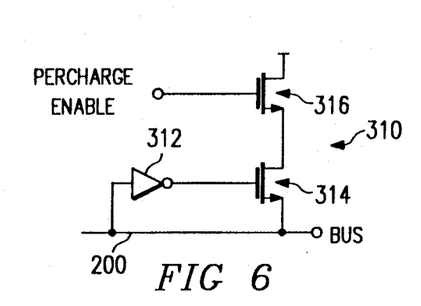
Figure 7:
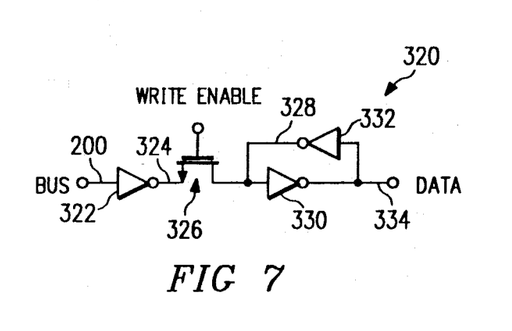

FIGS. 5, 6 and 7 are schematic electrical circuit diagrams illustrating alternative implementations of portions of the circuit shown in FIG. 4. In FIG. 5, a bus driver indicated generally at 300 is shown which is an alternative to the bus driver 202. Driver 300 includes an N-channel field effect transistor 302 connected in series with an N-channel field effect transistor 304 Proper application of READ ENABLE and $\overline{DATA}$ signals to the gates of transistors 302 and 304 will connect the bus line 200 to ground.

FIG. 6 illustrates an alternative bus precharge circuit indicated generally at 310. Precharge circuit 310 may be substituted for the precharge circuit shown at 205 in FIG. 4. An inverter sensing gate 312 is used instead of the NOR sensing gate 204. An input of the sensing gate 312 is connected to the bus line 200, while an output thereof is applied to the gate of an N-channel transistor 314. A PRECHARGE ENABLE signal is applied to the gate of a second N-channel field effect transistor which is connected in series with the channel of the N-channel transistor 314. Together, the channels of the transistors 316 and 314 are operable to connect a high supply voltage to the bus line 200.

FIG. 7 is a schematic electrical circuit diagram of a bus receiver indicated generally at 320, which may be substituted for the bus receiver 230. An inverter receiving gate 322 has its input connected to the bus 200 and an output connected to a node 324. An N-channel field effect transistor indicated generally at 326 has a channel operable to connect the node 324 to a node 328 upon the application of a true state of a WRITE ENABLE signal to its gate. A latch is formed by inverters 330 and 332. The input of inverter 330 is connected to the node 328, while its output is connected to a data node 334. Node 334 is in turn connected to the input of the inverter 332, which in turn has an output connected to the node 328.

In summary, bus precharge and data receiver circuitry has been shown and described having novel and advantageous precharge characteristics. Disclosed is a VDD/2 precharge scheme in which the midpoint precharge voltage level is approached as an asymptote, thus minimizing overshoot. Establishing a switchpoint of the receiver at the switchpoint of the sensing gate of the bus precharge circuit allows maximum speed in writing data into the receiving latch.

While illustrated embodiments and their advantages have been disclosed in the foregoing detailed description, the invention is not limited thereto but only by the scope and the spirit of the appended claims.

What is claimed is:

1. A node precharging circuit, comprising:
   a sensing gate having an input connected to the node, a control output of the sensing gate assuming a varying state that is a function of a varying state of precharge of the node; and
   precharging circuitry operable to couple a supply voltage to the node, a control input of the precharging circuitry coupled to the control output of the sensing gate, said precharging circuitry gradually decoupling the supply voltage from the node in response to a continuous change in a predetermined direction of the state of the control output of the sensing gate.

2. The node precharging circuit of claim 1, wherein said precharging circuitry includes a field effect transistor having a current path for selectively coupling the supply voltage to the node, a control electrode of the transistor coupled to the control output of the sensing gate.

3. The circuit of claim 2, wherein said field effect transistor is a P-channel field effect transistor, said supply voltage being substantially lower than a precharge voltage to which the node is to be precharged.

4. The circuit of claim 2, wherein said transistor is an N-channel transistor, said supply voltage being substantially higher than a precharge voltage to which the node is to be precharged.

5. In an integrated circuit, the combination comprising:
   a sensing gate of a precharge circuit;
   a bus line, an input of the sensing gate coupled to the bus line; and
   at least one data receiver having a receiving gate, an input of the receiving gate coupled to the bus line, conductance switchpoints of the sensing gate and the receiving gate being substantially equal.

6. The integrated circuit of claim 5, wherein said sensing gate and data receiver are coupled to a supply voltage, said sensing gate and data receiver capable of operation for any value of said supply voltage between about 2.5 and about 6.0 volts.

7. The integrated circuit of claim 6, wherein said supply voltage is selected from the group consisting of 3.0 and 5.0 volts.

8. The integrated circuit of claim 5, wherein said sensing gate and said receiving gate each comprise:
   a first field effect transistor having a channel of a first conductivity type, a current path coupled between a supply of a first supply voltage and an output node, a second field effect transistor having a channel of a second conductivity type opposite said first conductivity type and coupled between said output node and a supply of a second supply voltage, control electrodes of said first and second transistors coupled in parallel to an input node;
   wherein the ratio between channel widths of said first and second field effect transistors in the sensing gate is substantially same as the ratio of channel widths of the first and second field effect transistors in the receiving gate.

9. The integrated circuit of claim 8, and further comprising a third transistor having a current path coupling the current path of said first field effect transistor and said supply of said first supply voltage, and a fourth transistor having a current path coupling said channel of said second field effect transistor to said supply of said second supply voltage, control electrodes of said third and fourth transistors coupled to clocking signals.

10. A node precharging circuit for precharging a node operable to assume a selected one of two data states, said node precharged to a preselected precharge voltage between said two data states, the precharging circuit comprising:
   a latch having an input coupled to the node during a data phase, an output of the latch having a state reflecting a state of the node last sensed by the latch;
   a supply of a first supply voltage;
   a supply of a second supply voltage;
   a first switching device operable to couple the first supply voltage to the node in response to a first state of the output of the latch; and
   a second switching device operable to couple the second supply voltage to the node in response to a second state of the output of the latch.

11. The node precharging circuit of claim 10, wherein said circuit will be operable for any value of said first supply voltage between about 2.5 and about 6.0 volts.

12. The node precharging circuit of claim 11, wherein the values of said first supply voltage is selected from the group consisting of 3 volts and 5 volts.

13. The node precharging circuit of claim 10, wherein said data states of said node consist of a high data voltage above said preselected precharge voltage, and a low data voltage substantially below said preselected precharge voltage, said first supply voltage being higher than said preselected precharge voltage and said second supply voltage being lower than said preselected precharge voltage, said first switching device operable to couple the first supply voltage to the node responsive to the latch sensing a low data voltage on the node, said second switching device operable to couple the second supply voltage to the node in response to said latch sensing a high data voltage on said node.

14. The circuit of claim 10, wherein said first switching device includes a field effect transistor having a current path and a control electrode, said current path selectively coupling said first supply voltage to said node in response to said first state of the output of the latch appearing on the control electrode.

15. The node precharging circuit of claim 14, and further comprising a second field effect transistor having a current path coupled in series with said field effect transistor, said field effect transistors operable to couple said first supply voltage to said node, a sensing circuit having an input coupled to said node and an output coupled to said control electrode of said second field effect transistor, said sensing circuit operable to shut off said second field effect transistor after said preselected precharge voltage has been attained.

16. The node precharging circuit of claim 10, wherein said second switching device comprises a field effect transistor having a current path and a control electrode, said current path operable to selectively couple said second supply voltage to said node in response to said second state of the output of the latch appearing on said control electrode.

17. The node precharging circuit of claim 16, and further comprising a second field effect transistor having a current path and a control electrode, said current path of said second field effect transistor coupled in series with the current path of said field effect transistor to selectively couple said second supply voltage to said node, said circuit further including a sensing circuit having an input connected to said node and an output coupled to said control electrode of said second field effect transistor, said sensing circuit operable to shut off said second transistor responsive to sensing said preselected precharge voltage on said node.

18. The node precharging circuit of claim 10, and further comprising at least one pass gate interposed between said input of said latch and said node, said pass gate operable to connect said input of said latch to said node during a data phase of an operation cycle of said node precharging circuit, said pass gate operable to isolate said input of said latch from said node during a precharge phase of an operating cycle of said node precharge circuit.

19. The node precharging circuit of claim 10, wherein said latch comprises a first inverter having an input coupled to the node and an output, a second inverter having an input connected to the output of said first inverter, an output of said second inverter coupled to said output of said latch.

20. A precharging circuit for precharging a line to a precharge voltage lower than a first data voltage and higher than a second data voltage, comprising:
   a pullup circuit operable to couple said line to a supply of a first supply voltage responsive to said second data voltage on said line, and gradually decoupling said first supply voltage from said line as the voltage on said line rises to said precharge voltage; and
   a pulldown circuit operable to couple said line to a supply of a second supply voltage lower than said first supply voltage responsive to a high state on said line and gradually decoupling said second supply voltage from said line as the voltage on said line falls to said precharge voltage.

21. The precharging circuit of claim 20, wherein said precharge voltage is approximately halfway between said first data voltage and said second data voltage.

22. The precharging circuit of claim 20, wherein said precharging circuit is capable of operation for any value of said first supply voltage between about 2.5 volts and about 6.0 volts.

23. A precharge circuit for charging a bus line comprising:
   a transfer gate having at least one control node and a path for selectively coupling said bus line to a first node in response to a predetermined state on said control node, a precharge signal selectively applied to said control node;
   a latch selectively coupled to said bus line for storing a state of said bus line prior to precharging and having an output;
   a bus line precharge sensing circuit coupled to said bus line for sensing the degree to which said bus line is precharged;
   a pullup circuit coupled to a first voltage supply and said first node, an output of said latch coupled to a select input of said pullup circuit, an output of said sensing circuit coupled to a shutoff input of said pullup circuit, said pullup circuit operable to pull a voltage on said bus line toward said first voltage supply upon receiving a predetermined state of said output of said latch, said sensing circuit shutting off said pullup circuit when a first predetermined voltage on said bus line is reached; and a pulldown circuit coupled to a second voltage supply and said first node, an output of said latch coupled to a select input of said pulldown circuit, an output of said sensing circuit coupled to a shutoff input of said pulldown circuit, said pulldown circuit operable to pull a voltage on said bus line toward said second voltage supply upon receiving a predetermined state from said output of said latch, said sensing circuit operable to shut off said pulldown circuit when a second predetermined voltage on said bus line is reached.

24. The precharge circuit of claim 23, wherein said first and second predetermined voltages are the same.

25. A bus line precharging circuit, comprising:
pullup circuitry coupled to a supply of a supply voltage and said bus line and having a control input, said pullup circuitry operable to couple said supply voltage to said bus line;

a sense gate having an input coupled to said bus line, an enable input, and an output coupled to said control input of said pullup circuitry, said sense gate operating said pullup circuitry responsive to a voltage on said bus line being lower than a predetermined precharge voltage and responsive to a predetermined state of said enable input.

26. The bus line precharging circuit of claim 25, wherein said output of said sense gate is operable to gradually turn off said pullup circuitry in response to a rising voltage on said bus line.

27. The bus line precharging circuit of claim 25, wherein said input of said sense gate is coupled to an inverter of said sense gate, said inverter of said sense gate having a first voltage switchpoint; and
at least one receiving register coupled to said bus line, an inverter of said receiving register having a second switchpoint, the switchpoint of said inverter of said sense gate being slightly higher than the switchpoint of the inverter of said receiving gate.

28. The bus line precharging circuit of claim 27, wherein said inverter of said sense gate includes a P-channel field effect transistor having a current path and a an N-channel field effect transistor having a current path coupled in series with the current path of said P-channel transistor, a control electrode of said N-channel transistor coupled in parallel with a control electrode of said P-channel transistor to said sense gate input, a gating transistor having a current path selectively coupling the current path of said P-channel transistor to a high voltage supply;

an output node of said sense gate inverter joined to ends of said current path of said P-channel and said N-channel transistors;

said pullup circuitry comprising an N-channel field effect transistor having a current path selectively coupling a high voltage supply to said bus line, a gate of said N-channel field effect transistor of said pullup circuitry coupled to said output node of said inverter; and a third N-channel field effect transistor having a current path selectively coupling said output node to ground, a gate of said third N-channel field effect transistor coupled to said enable input, a first state of said enable input grounding said output node using said third N-channel transistor, a second state of said enable input permitting the coupling of a high voltage supply to said output node using said gating transistor.

29. A method for precharging a node in an integrated circuit, comprising the steps of:
sensing a voltage state of the node using a sensing circuit;
responsive to the sensing circuit sensing the state of the node, outputting a control output signal from the sensing circuit;
responsive to a predetermined state of the control output signal, coupling a supply of a supply voltage to the node;
continuously changing the voltage state of the node in a predetermined direction;
responsive to the continuous change of the voltage on the node, continuously changing the state of the control output signal; and
responsive to said step of continuously changing the control output signal, gradually decoupling the supply voltage from the node, until the node has reached a desired precharge voltage and the supply voltage is decoupled from the node.

30. A method for precharging a node to a preselected precharge voltage having a value between a high data voltage and a low data voltage, comprising the steps of:
during a data phase of an operation cycle, latching one of said high and low data voltages into a latch; and
dependent upon the state stored in said latch, coupling a selected one of a high and a low supply voltage to the node to establish the preselected precharge voltage on the node.

* * * * *